United States Patent [19]

Moldovan et al.

[11] Patent Number: 5,132,497
[45] Date of Patent: Jul. 21, 1992

[54] MAGNETIC SHIELDING MEANS FOR A CURRENT SENSOR OF DIRECT CURRENT SWITCHING APPARATUS

[75] Inventors: Peter K. Moldovan, Cascade; John M. Reske, Greenfield, both of Wis.

[73] Assignee: Eaton Corporation, Cleveland, Ohio

[21] Appl. No.: 749,777

[22] Filed: Aug. 26, 1991

[51] Int. Cl.⁵ .......................... H01H 9/44; H01H 9/30
[52] U.S. Cl. ............................ 200/147 A; 200/144 R; 335/201
[58] Field of Search ................... 200/147 A; 335/201, 335/144 R

[56] References Cited

U.S. PATENT DOCUMENTS 5,004,874  4/1991  Theisen et al. ............... 200/144 R Primary Examiner—Harold Broome
Attorney, Agent, or Firm—L. G. Vande Zande

[57] ABSTRACT

A Hall effect device is located in a focused gap of a flux concentrator disposed over one power terminal of a D.C. switching contactor to monitor flux induced by current flow. Magnetic fields from permanent magnets of the switching apparatus are shielded from the flux concentrator by a cup-shaped magnetic ring surrounding the concentrator, magnetically spaced therefrom, and a magnetic plate of the apparatus which is modified to accept more flux in a localized area of the sensor before saturation. The gap of the concentrator in which the Hall effect device is located is particularly positioned at a point where the magnetic field gradient from the permanent magnet field is minimum.

14 Claims, 4 Drawing Sheets

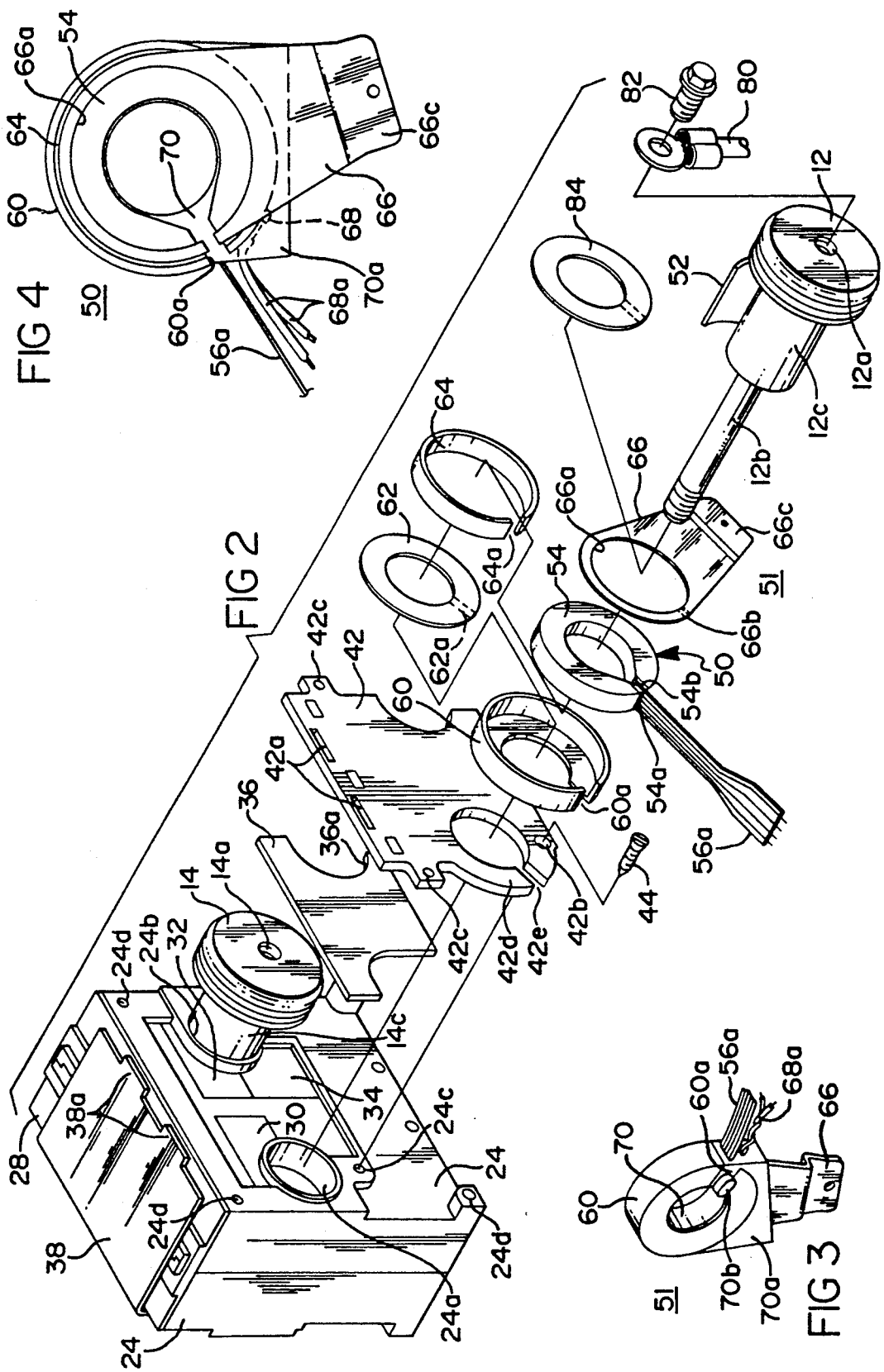

MAGNETIC SHIELDING MEANS FOR A CURRENT SENSOR OF DIRECT CURRENT SWITCHING APPARATUS

BACKGROUND OF THE INVENTION

This invention relates to magnetic shielding for a current sensor of direct current switching apparatus which utilizes permanent magnet fields for driving an arc off the contacts into an arc splitter structure. More particularly, the invention relates to magnetic shielding means for a current sensor to negate affects of the permanent magnets on the current sensing means.

Apparatus for switching high voltage D.C. power is disclosed and claimed in U.S. Pat. No. 5,004,874 issued Apr. 2, 1991, the disclosure of which is incorporated herein by reference, and which patent is assigned to the assignee of the present invention. The D.C. switching apparatus disclosed in the aforementioned patent comprises an electromagnetically operated contactor wherein a movable bridging contact is driven into and out of engagement with a pair of stationary contacts mounted on contact supports which are connected with external terminals connectable to a power supply. The stationary contacts are disposed in arc chambers which comprise a plurality of splitter plates and arc runner surfaces leading from the contact to the splitter plates. Permanent magnets are disposed externally of the arc chambers to establish a magnetic field through the respective arc chamber, which magnetic field co-acts with current in an arc drawn between movable and stationary contacts to create a force which moves the arc from the respective contacts into the arc splitter plates for interruption of the arc. The switching apparatus is disclosed as being contained in a sealed envelope which may contain a control electronics module and ancillary snap action switches or the like which are electrically connected to a multi-pin connector module mounted to the envelope.

The D.C. switching apparatus may incorporate a current sensor connected to the control electronics module for operating the D.C. switching apparatus to an open condition upon detection of a predetermined current level flowing through the switching apparatus. Such current sensors commonly convert a current induced magnetic field to an analog voltage output signal. Such output signal may be utilized by measuring apparatus to provide a visual readout of the voltage, by control apparatus to initiate some function or by a microprocessor as an input to a larger system. In switching apparatus of the aforementioned type, the current sensor can be incorporated to provide over-current protection in the apparatus wherein the output signal of the sensor is applied to the control electronics module which in turn controls the electromagnet of the switching apparatus to cause the movable contacts to be moved out of engagement with the stationary contacts, thereby opening the circuit in the function of a circuit breaker. However, the relationship and magnitude of the magnetic field induced by current flow in the contactor past the transducer is necessarily very sensitive to obtain the desired accuracy. Such accuracy can be particularly affected in D.C. switching apparatus of the aforementioned type wherein permanent magnets are utilized to move the arc from the contacts into the arc splitter plates. Such permanent magnets can also create fringing flux patterns which can adversely impact the magnetic field seen by the transducer to provide inaccurate current readings.

A current sensor for switching apparatus of the aforementioned type requires particular attention to such details as location, orientation, and magnetic shielding. When the switching apparatus is utilized to provide over-current protection such as a circuit breaker, it is also important that the analog output signal of the current sensor be linear throughout the entire range of current levels to be detected.

SUMMARY OF THE INVENTION

This invention provides a magnetic shielding means for a current sensor of D.C. switching apparatus which utilizes permanent magnet magnetic fields for moving an arc from the contacts into an arc extinguishing splitter plate arc chamber, the magnetic shielding means and the current sensor being particularly located with respect to the arc driving magnetic field so as to minimize any adverse affect of said arc driving magnetic field on the current sensor. The current sensor comprises a flux concentrator for receiving and concentrating flux induced by current flow in the switching apparatus in a particular direction and/or orientation with regard to a magnetic transducer and this invention addresses the location, shape and orientation of the flux concentrator and transducer with regard to the magnetic field utilized for driving the arc into the arc splitter plates. The invention also provides particular magnetic shielding features for the current sensor to minimize any adverse affect of the arc driving magnetic field on the transducer. The foregoing and other features and advantages of this invention will become more readily apparent and understood when reading the following description and appended claims in conjunction with the drawings.

BRIEF DESCRIPTION OF THE DRAWINGS

FIG. 2 is an exploded isometric view of the magnetic shielding means of this invention for the current sensor and portions of the D.C. switching apparatus on which it is utilized;

FIG. 3 is an isometric view of the magnetic shielding means of this invention and current sensor after potting material has been applied;

FIG. 4 is a front elevation view of the magnetic shielding means of this invention with the current sensor after potting material has been applied;

DETAILED DESCRIPTION OF THE PREFERRED EMBODIMENT

Figure 1:
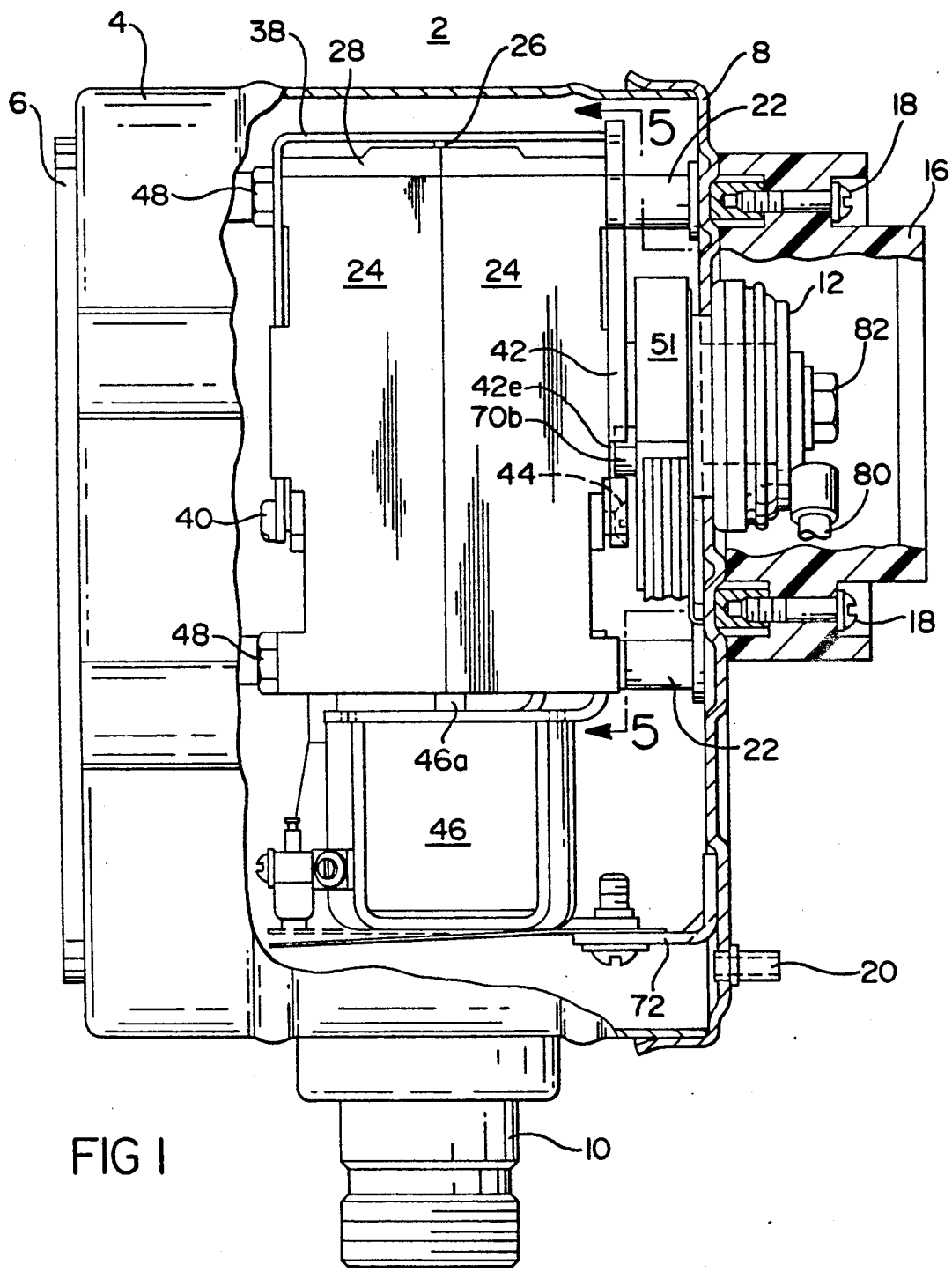
FIG. 1 is a side elevation view of D.C. switching apparatus incorporating the magnetically shielded current sensor of this invention with a portion of the external envelope broken away.
Figure 5:
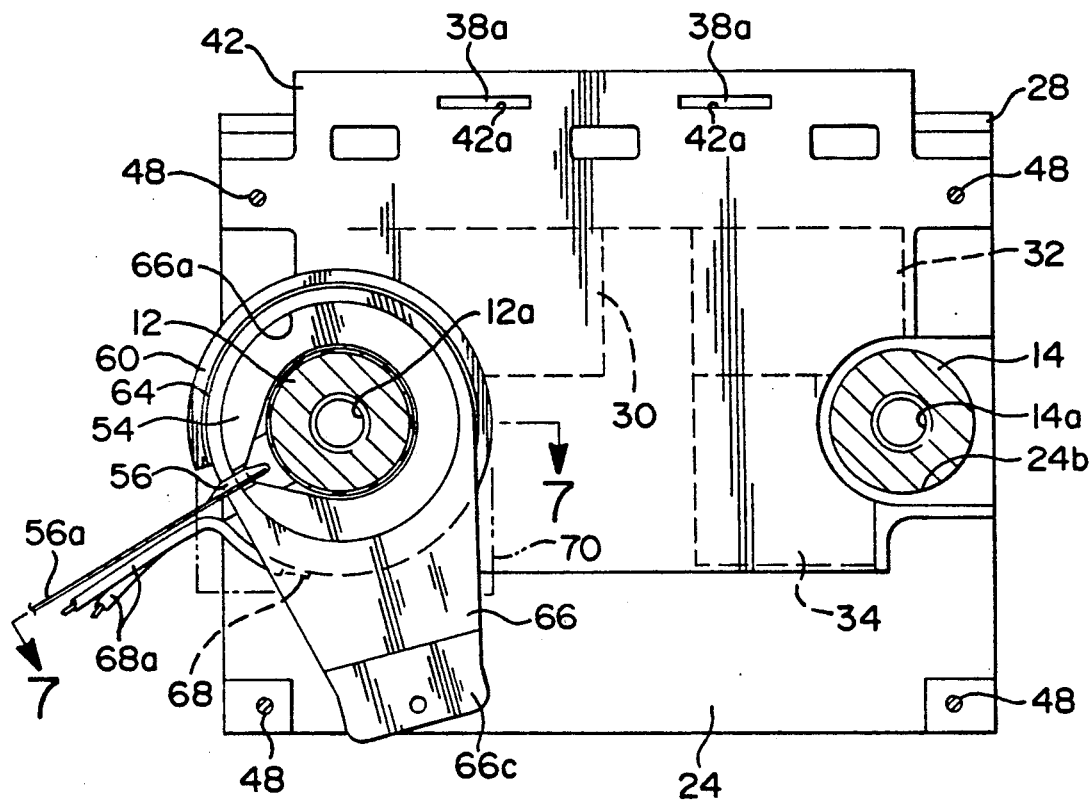
FIG. 5 is a sectional view taken along the line 5—5 in FIG. 1.

The D.C. switching apparatus is embodied in an electromagnetic contactor 2 shown in FIG. 1 and more fully described in the aforementioned U.S. Pat. No. 5,004,874. The contactor 2 comprises an outer metal envelope comprising a can 4 having a mounting plate 6 welded or similarly affixed to the back thereof and a header 8 hermetically welded over an open front side of can 4. A multi-pin connector 10 is mounted and hermetically welded within an opening in a bottom wall of can 4 to provide connection to control electronics (not shown) for the D.C. switching apparatus within the envelope. D.C. power terminals 12 and 14 are attached and hermetically sealed to header 8, electrically insulated therefrom, to extend through the header. The portions of terminals 12, 14 projecting externally of the envelope have tapped holes 12a, 14a for receiving screws (not shown) which attach power conductors (not shown) to the terminals. A generally T-shaped insulating barrier 16 is attached to header 8 by a pair of screws 18 which threadably engage tapped sleeves welded to the exterior of header 8. Barrier 16 isolates the power terminals 12, 14 and respectively attached conductors from each other and provides a protective cover thereover to reduce electrical shock hazard. Header 8 is also provided with a tubular fitting 20 through which the seal of the contactor assembly may be checked and the contactor assembly may be evacuated and filled with a controlled atmosphere medium such as an inert gas or the like, after which the fitting 20 is crimped shut and sealed.

The D.C. switching apparatus is built up upon and attached to the interior of header 8 prior to joining the external envelope members 4 and 8 together. Four internally tapped posts 22 (only two of which can be seen in FIG. 1) are attached to the interior of header 8 by welding or the like. D.C. switching apparatus comprises two identical molded insulating housing assemblies 24 disposed back to back, within which and to which other components of the apparatus are mounted, to provide a pair of arc extinguishing chambers. The other components referred to hereinabove are not specifically shown in the drawings of this application, but are fully described in U.S. Pat. No. 5,004,874 incorporated herein by reference. Generally, the molded insulating housings 24 position and hold together a center barrier comprising a magnetic plate 26 sandwiched between a pair of flat insulating plates to define two separate arc extinguishing chambers, each of which having a plurality of arc splitter plates trapped between the center barrier and the respective housing assembly 24 in proximity to a pair of stationary contact supports, each of which define arc runner surfaces leading to the respective arc splitter plates. A molded insulating cover 28 is attached over the upper end of the arc chamber housing assemblies 24, the cover 28 having an elongated central slot through which the central magnetic plate 26 (FIG. 1) extends.

A plurality of permanent magnets are positioned within appropriately shaped pockets in an external surface of the respective transversely extending wall of molded housing assemblies 24 to provide a magnetic field across the respective arc extinguishing chambers defined by the housings. A plurality of small magnets are used instead of one larger magnet to optimize the magnetic field, applying a specific magnetic field intensity in local areas without applying an excessive and undesirable magnetic field intensity generally across the chamber. Referring particularly to FIG. 2, three permanent magnets 30, 32 and 34 are disposed within respective pockets in a transversely extending wall of molding 24. The magnets 30-34 are disposed to one side of and partially around molded sleeves for openings 24a and 24b which receive the terminals 12 and 14 therein, respectively. To localize the permanent magnet magnetic fields, only one magnet 30 is adjacent opening 24a whereas two magnets 32 and 34 are adjacent opening 24b. One of the stationary contacts of the D.C. switching apparatus is attached to a stationary contact support and arc runner mounted to terminal 14 within the arc chamber defined by the right-hand housing 24 while the other stationary contact is mounted to a similar support and arc runner structure disposed within the arc chamber defined by the left-hand housing 24 and is attached to terminal 12. Accordingly, the arrangement of permanent magnets on the face of left-hand housing 24 (which is hidden from view in FIG. 2) is opposite that of the right-hand housing 24 inasmuch as two permanent magnets are positioned adjacent the opening for terminal 12 whereas the singular permanent magnet is positioned adjacent the opening for terminal 14. An additional, larger permanent magnet 36 is disposed over the three permanent magnets 30, 32 and 34 as seen in FIG. 2. Magnet 36 fits within a pocket in the transverse surface of housing 24. Permanent magnet 36 is unsymmetrical in that it includes a portion 36a which extends around the molded sleeve for opening 24b coincident with the permanent magnet 34. Although not shown, the similar large permanent magnet for the opposite side of the switching apparatus is unsymmetrical by including a portion that extends around the molded sleeve defining an opening for the terminal 12. By offsetting the number and shape of the magnets, the magnetic field applied across the arc extinguishing chamber is localized, strengthened in the area of the stationary contacts and weakest in the area where the stationary contacts are absent.

A ferromagnetic flux return path is provided for the switching apparatus. The center magnetic plate 26 projects above the molded cover 28 and housing members 24. An inverted L-shaped magnetic plate 38 is disposed over the permanent magnetic assembly of the left-hand molded insulating housing 24 in FIG. 2 and extends over the top of the housing assemblies 24, resting upon the upper edge of center plate 26. The lower edge of L-shaped plate 38 is held against the magnets and the housing by a screw 40 (FIG. 1). A third magnetic plate 42 is positioned over the permanent magnet 36 and is held against the face of the right-hand housing 24 by a screw 44 which passes through a countersunk hole 42b and threads into hole 24c in housing 24. Plate 42 has a pair of slots 42a along the upper edge which are engaged by tabs 38a of plate 38. The respective permanent magnets are arranged to establish magnetic fields across the respective arc chambers defined within the molded housing parts 24, the fields having flux paths which are directed upwardly along the plate 42 and the vertical extension of plate 38, inwardly along the top portion of plate 38, and downwardly through the center plate 26.

An electromagnet actuator assembly 46 for the switching apparatus has a frame attached to the bottom of molded housing assemblies 24 and has a solenoid plunger 46a (FIG. 1) that extends through an open bottom of housing assemblies 24 to be connected to a movable bridging contact assembly (not shown) which is guided for movement within the housing assemblies 24 into and out of engagement with the respective stationary contacts. The coil assembly of electromagnetic actuator assembly 46 may be connected to multipin connector 10 for external control and/or to the electronics module (not shown) within the envelope for internal control. The coil assembly may be a single coil arranged to be energized with opposite polarities on subsequent or alternate energizations, or may comprise two oppositely wound coils which are alternately energized. In either embodiment, the plunger 46a is positively driven to an extended position to close the switching contacts within the housing assemblies 24, and is positively driven to a retracted position to open the switching contacts.

The switching apparatus hereinabove described is mounted upon the posts 22 on the inside of header 8 by positioning the apparatus over the power terminals 12 and 14 against the posts 22. Screws 48 extend through holes 24d in the four corners of the molded insulating housing assemblies 24 to thread into the openings of posts 22. The upper pair of screws 48 also extend through aligned holes in the magnetic plate 38 and similar holes 42c in magnetic plate 42 to secure the upper ends of the magnetic plates to the respective housing assembly 24. The threaded shaft 12b of terminal 12 and a similar shaft of terminal 14 extend through and connect with respective stationary contact supports by nuts (not shown) which thread onto the ends of the respective threaded shafts at the opposite side of the housing assemblies 24, thereby securely clamping the stationary contact supports firmly against annular shoulders of respective enlarged conductor portions 12c and 14c of power terminals 12 and 14, respectively.

Figure 6:
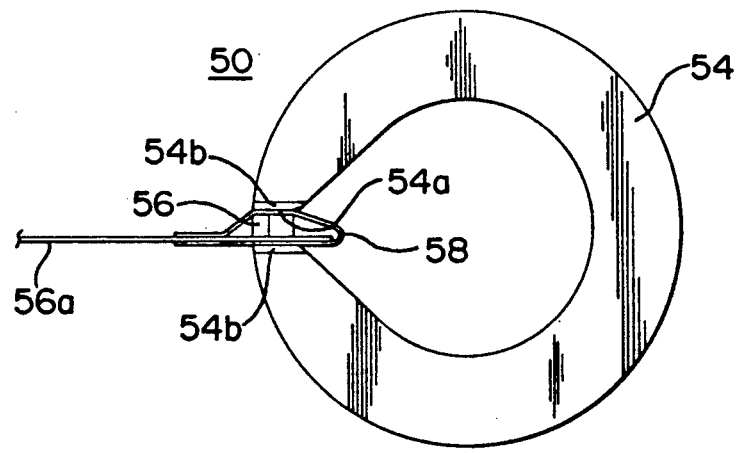
FIG. 6 is a front elevational view of a flux concentrator and a transducer of the current sensor shielded by the magnetic shielding means of this invention.

The current sensor 50 invention is disposed over one of the conductor portions 12c or 14c of power terminals 12 or 14, respectively, between header 8 and magnetic plate 42. The enlarged conductor portion 12c of terminal 12 is provided with several turns of thin electrically insulating tape 52 to electrically isolate the current sensor 50 from the terminal. As will be apparent from the drawings, the current sensor 50 is assembled over the threaded shaft and enlarged conductor portion of the respective power terminal 12 or 14 prior to the aforedescribed assembly of the switching apparatus to the terminals 12 and 14 and header 8. According to this invention, current sensor 50 is preferably assembled over power terminal 12 inasmuch as the magnetic field from the permanent magnets of the right-hand housing is weakest at that terminal due to the arrangement of the permanent magnets as hereinbefore described. The particular arrangement of permanent magnets provides non-uniform magnetic field gradient around terminal 12 which is, on average, weaker than the magnetic field gradient around terminal 14. Current sensor 50 comprises a flux concentrator 54, which comprises a ring of magnetic material such as soft magnetic steel or the like, and a magnetic transducer such as a Hall effect device 56. As seen best in FIG. 6, flux concentrator 54 has a radially directed slot 54a extending therethrough. The inner diameter of the ring is tapered outwardly adjacent the ends of the ring defined by slot 54a to gradually reduce the cross section of the ring as it approaches the slot 54a. The faces of flux concentrator 54 which are defined by the slot 54a are further reduced in cross sectional area by chamfering the edges of the slot 54a adjacent a front face of the ring 54 approximately 45° at 54b (FIG. 6). The combined taper and chamfer define reduced surface area faces for the slot which provide a focusing of magnetic flux in the concentrator 54. Hall effect device 56 is intimately bonded and electrically connected to a flexible strip connector 56a and is afforded additional protection by wrapping a strip of tape 58 over the end of the connector strip 56a and the Hall effect device 56. This transducer assembly is positioned and fixed within the slot 54a by an adhesive.

One aspect of the magnetic shielding of current sensor 50 according to this invention comprises particular shaping of magnetic plate 42 to better contain or prevent fringing flux patterns of the permanent magnet field, particularly in the area of terminal 12 and current sensor 50. In this respect, plate 42 is made approximately twice the thickness of the other plates 26 or 38 in the magnetic flux path around the housing 24 of the switching apparatus. Additionally, plate 42 comprises a ring 42d which is disposed around terminal 12. The ring portion 42d has a radially directed slot 42e which is located at a point where the magnetic field gradient about terminal 12 is a minimum. The increased thickness of plate 42 and the ring 42d accept and contain permanent magnet generated flux in the area of current sensor 50, reducing fringing flux patterns from interfering with the current sensor 50.

The magnetic shielding of current sensor 50 further comprises a cup-shaped magnetic ring 60 which has a slot 60a radially directed therethrough. A non-magnetic, spacer 62 is attached to the inside surface of cup-shaped ring 60 by an adhesive material. When the spacer is firmly bonded to ring 60, material 62a is removed to provide a slot in the spacer correspondingly aligned with slot 60a in ring 60. A strip of non-magnetic material is formed into a shape of a slotted ring 64 which is disposed around the internal periphery of cup-shaped ring 60, a slot 64a of ring 64 being aligned with the slot 60a of cup-shaped ring 60. Flux concentrator 54 is disposed within the cup-shaped ring 60, magnetically spaced from the ring 60 by the spacer 62 and non-magnetic spacing ring 64. An electrical grounding strap 66 of copper or similar conductive material having a circular opening 66a in one end is soldered to the flux concentrator 54. The grounding strap 66 may include a radially directed slot coincident with slots 54a and 60a, and if provided, such slot is preferably formed in the strap 66 after soldering to the flux concentrator 54 by removing the material 66b (FIG. 2) of strap 66 that spans the gap of slot 54a of the flux concentrator. The transducer assembly is preferably bonded within the slot 54a of flux concentrator 54 subsequent to soldering grounding strap 66 to concentrator 54. Flux concentrator 54 with grounding strap 66 soldered thereto and the transducer assembly bonded within slot 54a is inserted within the non-magnetic spacer ring 64 against non-magnetic spacer 62, thereby being magnetically spaced from the rim and bottom of cup-shaped magnetic ring 60, respectively. A resistance-temperature device (RTD) 68 utilized in the Hall effect device sensing circuit is bonded to the outer surface of cup-shaped ring 60 by an adhesive bonding agent or tape, or both. The wires 68a of the RTD 68 are brought away from the assembly under the flexible strip connector 56a for the transducer assembly. This assembly of current sensor 50, cup-shaped shield 60, spacers 62 and 64 grounding strap 66 and thermistor 68 is then partially potted in an electrically insulating potting compound 70 to form a magnetically shielded current sensor assembly 51 having a generally rectangular block 70a at the lower portion thereof. The potting compound 70 securely locates the transducer assembly, the thermistor 68 and the respective wire conductor leads 56a and 68a within the assembly 51. It also provides a thin electrically insulating liner on the interior surface of flux concentrator 54 as seen particularly in FIG. 7. Also, referring to FIGS. 3 and 7, a positioning boss 70b is molded integrally from the potting compound, the boss extending rearwardly from the magnetically shielded current sensor assembly 51 parallel with and disposed coincident with the slot 60a.

Figure 7:
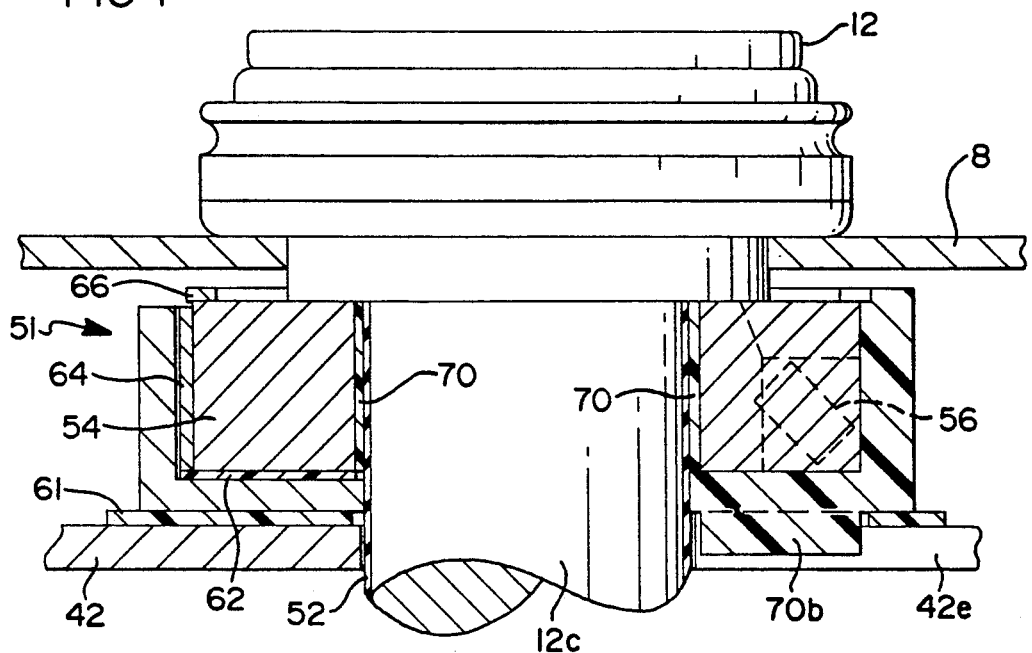
FIG. 7 is a cross sectional view taken along the line 7—7 in FIG. 5.

The magnetically shielded current sensor assembly 51 is mounted to header 8 prior to assembly of the switching apparatus thereto. The magnetically shielded current sensor assembly 51 is positioned over the conductor portion 12c of terminal 12 such that an offset tab 66c of the grounding strap is positioned against the interior surface of header 8. Rotational orientation of magnetically shielded current sensor assembly 51 to header 8 is attained by temporarily positioning a spare magnetic plate 42 to the top pair of posts 22 whereby the boss 70b of shielded current sensor assembly 51 is disposed within the gap of the radially directed slot 42e of the magnetic plate 42. Sensor assembly 51 is bonded, such as with an epoxy compound or the like, to an insulator portion of terminal 12 and is permitted to thoroughly cure before removing the temporary positioning plate. So positioned, the offset tab 66c of grounding strap 66 is then soldered to the interior surface of header 8. The D.C. switching apparatus is then assembled to the posts 22 as aforedescribed and to a supporting bracket 72 (FIG. 1) also secured to the inner surface of header 8. The amount of offset of grounding strap 66 and the overall thickness of magnetically shielded current sensor assembly 51 insure that a space will be present between plate 42 and cup-shaped ring 60 to magnetically separate these elements of the magnetic shielding of this invention. However, a non-magnetic spacer ring 61 as seen in FIG. 7 may also be inserted over terminal 12 between cup-shaped ring 60 and plate 42 to further insure magnetic separation of these elements. The connector strap 56a of transducer 56 and the wires 68a of thermistor 68 are connected to the onboard electronics module and/or the multi-pin connector 10.

In applications where the D.C. switching apparatus hereinbefore described is used as an overcurrent protective device such as a circuit breaker, the electrical conductors of strip connector 56a of transducer 56 are connected to the electronics module (not shown) within can 4 of the electromagnetic contactor 2. Current passing through the switching apparatus is monitored by the current sensor 50, i.e. current flowing in terminal 12 induces a magnetic field in flux concentrator 54. The flux of the induced field is compressed, or focused, at the narrowing cross-section adjacent the magnetic gap of slot 54a. The flux (proportional to current flowing in terminal 12) is measured in the gap 54a by the transducer 56 and a proportional analog voltage signal is provided to the electronics module. In the event current flow exceeds a predetermined value, the voltage signal to the electronics module produces an output signal to the actuator coil assembly 46 to effect movement of the plunger 46a and the movable contacts to separate the switching contacts of the D.C. switching apparatus, thereby interrupting current flow through the apparatus.

Figure 8:
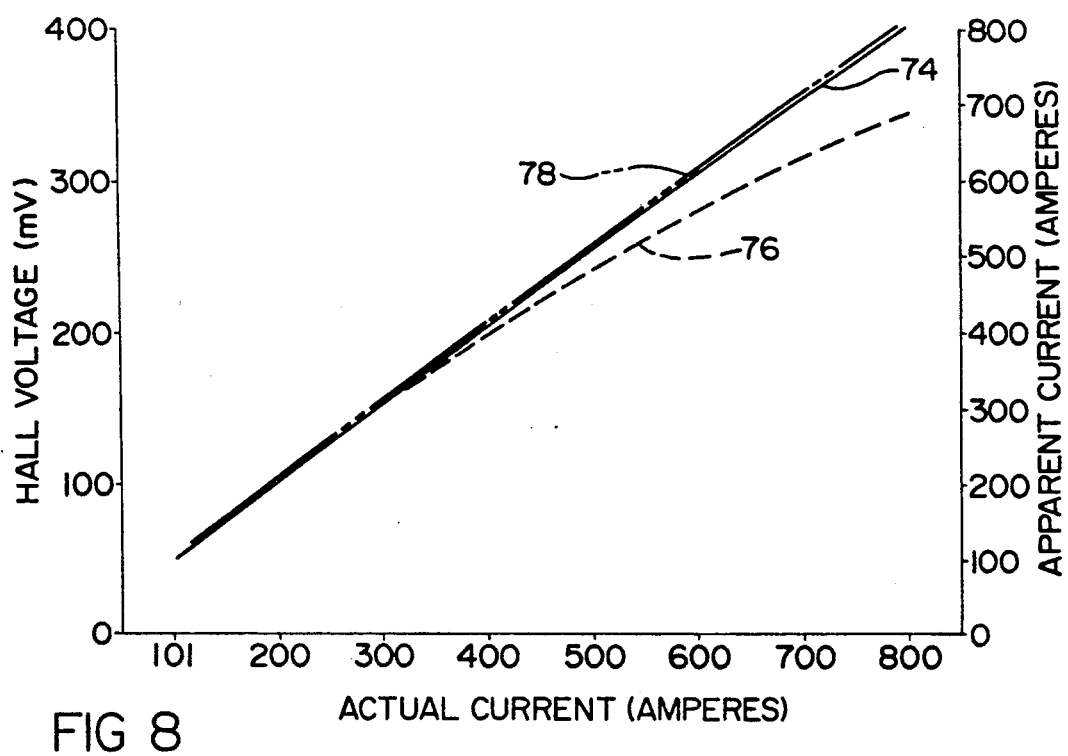
FIG. 8 is a trip curve for the switching apparatus utilizing the current sensor and the magnetic shielding means of this invention.

Overcurrent protective apparatus affords over-current protection through a current range, e.g. 0 to 800 amps, and therefore a trip curve for such apparatus must be linear through the entire range as represented by the solid line graph 74 in FIG. 8. In situations where fringing flux from the permanent magnets of the D.C. switching structure impinge upon the flux concentrator 54, the linearity of the trip curve drops off before the midpoint at approximately 300 amps as shown by the dotted line curve 76 in FIG. 8. By incorporating the particular magnetic shielding means of this invention, a full-range linear trip curve such as shown by dot-dash line 78 in FIG. 8 is achievable. The magnetic shielding means of this invention increases the magnetic flux capacity of magnetic plate 42 of the flux return path by increasing the material thickness and providing a slotted ring around the power terminal 12 to mimic the flux concentrator 54, thereby reducing and/or limiting the amount of flux that leaks from the permanent magnet induced field. The cup-shaped magnetic shield 60 surrounding, but magnetically spaced from, flux concentrator element 54 and magnetic plate 42, absorbs any fringing flux that escapes the magnetic plate 42. Therefore, only flux induced by current flowing in terminal 12 appears in flux concentrator 54, and the output signal of transducer 56 is truly indicative of current flow.

In certain applications of the D.C. switching apparatus to which this invention pertains, it may be desirable to fully enclose the current sensor 50 by magnetic shielding material. For example, a conductor 80 (FIGS. 1 and 2) connected to power terminal 12 externally of the switching apparatus by a screw 82 which is threadably received in hole 12a, will be oriented at right angles to the axis of power terminal 12. Thus, a magnetic field induced by current flow in the conductor 80 will impinge on flux concentrator 54 similarly to fringing flux patterns of the permanent magnet fields. A magnetic washer 84 may be inserted between the magnetically shielded current sensor assembly 51 and header 8, spaced from cup-shaped ring 60 by the thickness of grounding strap 66, to intercept and retain flux induced by current in conductor 80. Although not shown, the magnetic washer may also be a second cup-shaped magnetic member oppositely oriented to member 60.

While the foregoing has described a preferred embodiment and best mode contemplated of practicing the invention described and claimed herein, including at least one alternative embodiment. It is to be understood that the invention is susceptible to various other modifications without departing from the scope of the appended claims.

We claim:

1. Magnetic shielding means for a current sensor of direct current switching apparatus, said switching apparatus comprising:

a pair of stationary contacts;

conductor means extending from respective ones of said stationary contacts, said conductor means comprising terminal means connectable to a source of D.C. power;

movable contact means disposed for bridging engagement with said pair of stationary contacts;

electroresponsive means for moving said movable contact means into and out of bridging engagement with said stationary contacts;

arc chute means comprising a plurality of arc splitter plates adjacent said stationary contacts;

permanent magnet means disposed in proximity to said stationary contacts and said arc chute means, said permanent magnet means providing a magnetic field for moving an arc drawn between said stationary contacts on said movable contact means away from said stationary contacts and into said arc splitter plates;

said current sensor comprising:

a flux concentrator comprising an annular magnetic member disposed around said conductor means extending from one of said stationary contacts, said flux concentrator receiving a magnetic field induced by current flow in said conductor means, said annular magnetic member having a radially directed slot therethrough;

a magnetically responsive electric transducer disposed in said slot, said transducer having output terminal means for providing an output signal of said transducer proportionate to said induced magnetic field indicative of current flow in said conductor means; and said magnetic shielding means comprising a cup-shaped magnetic ring having a radially directed slot therethrough, said magnetic ring being disposed around said flux concentrator between said permanent magnet means and said flux concentrator, said magnetic ring being magnetically spaced from said flux concentrator and electrically isolated from said conductor means and receiving flux from said permanent magnet means magnetic field to block said flux from entering said flux concentrator.

2. The magnetic shielding means for a current sensor defined in claim 1 wherein said radially directed slot through said magnetic ring and said radially directed slot through said flux concentrator are coincidentally aligned.

3. The magnetic shielding means for a current sensor defined in claim 2 wherein said radially directed slots through said magnetic ring and said flux concentrator are directed away from said permanent magnet means.

4. The magnetic shielding means for a current sensor defined in claim 2 wherein said radially directed slots through said magnetic ring and said flux concentrator are directed angularly away from said permanent magnet means and from an other one of said conductor means.

5. The magnetic shielding means for a current sensor defined in claim 1 wherein said permanent magnet means comprises a plurality of permanent magnets and a magnetic path around said permanent magnets, said arc chute means and said stationary contacts.

6. The magnetic shielding means for a current sensor defined in claim 5 wherein said magnetic path comprises a plurality of contiguous magnetic plates, one of said plurality of magnetic plates proximate said current sensing means comprising greater material mass than an other of said plurality of magnetic plates for retention of more magnetic flux than said other of said plurality of magnetic plates.

7. The magnetic shielding means for a current sensor defined in claim 6 wherein said one of said magnetic plates comprises a projection having a hole therein, said projection being disposed around said conductor means spaced from said magnetic ring.

8. The magnetic shielding means for a current sensor defined in claim 7 wherein said projection has a radially directed slot therethrough and said radially directed slots through said magnetic ring and said flux concentrator are coincidentally aligned with said slot through said projection.

9. The magnetic shielding means for a current sensor defined in claim 8 wherein said radially directed slot through said projection is directed away from said permanent magnets.

10. The magnetic shielding means for a current sensor defined in claim 9 wherein said radially directed slot through said projection is directed angularly away from said permanent magnets and from an other one of said conductor means.

11. The magnetic shielding means for a current sensor defined in claim 10 wherein said slot through said flux concentrator provides parallel facing surfaces of said flux concentrator, ends of said flux concentrator adjacent said facing surfaces being tapered for smoothly reducing cross sectional mass of said flux concentrator and providing reduced-area facing surfaces.

12. The magnetic shielding means for a current sensor defined in claim 11 wherein said electric transducer comprises a Hall Effect transducer.

13. The magnetic shielding means for a current sensor defined in claim 1 wherein said magnetic shielding means comprises a second magnetic ring disposed substantially coincident with and spaced from said cup-shaped magnetic ring, said second magnetic ring being disposed between said flux concentrator and said terminal means.

14. The magnetic shielding means for a current sensor defined in claim 13 wherein said second magnetic ring comprises a cup-shaped magnetic ring disposed rim-to-rim with said first mentioned cup-shaped magnetic ring.

* * * * *